US011133266B2

(12) United States Patent
Ding et al.

(10) Patent No.: US 11,133,266 B2
(45) Date of Patent: Sep. 28, 2021

(54) SEMICONDUCTOR DEVICE AND METHOD OF FABRICATING THE SAME

(71) Applicant: Samsung Electronics Co., Ltd., Suwon-si (KR)

(72) Inventors: Shaofeng Ding, Suwon-si (KR); Jeong Hoon Ahn, Seongnam-si (KR); Yun Ki Choi, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/876,502

(22) Filed: May 18, 2020

(65) Prior Publication Data

US 2021/0125937 A1 Apr. 29, 2021

(30) Foreign Application Priority Data

Oct. 23, 2019 (KR) ........................ 10-2019-0132300

(51) Int. Cl.

| | |
|---|---|
| ***H01L 23/544*** | (2006.01) |
| ***H01L 21/48*** | (2006.01) |
| ***H01L 25/065*** | (2006.01) |
| ***H01L 25/18*** | (2006.01) |
| ***H01L 23/498*** | (2006.01) |
| ***H01L 25/00*** | (2006.01) |

(52) U.S. Cl.

CPC ........ *H01L 23/544* (2013.01); *H01L 21/4846* (2013.01); *H01L 23/49838* (2013.01); *H01L 25/0652* (2013.01); *H01L 25/18* (2013.01); *H01L 25/50* (2013.01); *H01L 2223/54426* (2013.01); *H01L 2225/06513* (2013.01); *H01L 2225/06517* (2013.01); *H01L 2225/06541* (2013.01); *H01L 2225/06593* (2013.01)

(58) Field of Classification Search

CPC ............... H01L 23/544; H01L 21/4846; H01L 25/0652; H01L 25/18; H01L 23/49838; H01L 25/50; H01L 2225/06593; H01L 2223/54426; H01L 2225/06513; H01L 2225/06517; H01L 2225/06541

See application file for complete search history.

(56) References Cited

U.S. PATENT DOCUMENTS

| | | | |
|---|---|---|---|
| 8,704,384 | B2 | 4/2014 | Wu et al. |
| 8,866,304 | B2 | 10/2014 | Rahman et al. |
| 8,957,512 | B2 | 2/2015 | Hisamura |
| 9,006,908 | B2 | 4/2015 | Pincu et al. |

(Continued)

*Primary Examiner* — Kyoung Lee

(74) *Attorney, Agent, or Firm* — Harness, Dickey & Pierce, P.L.C.

(57) ABSTRACT

A method of fabricating a semiconductor device comprises forming first and second align keys in a wafer, the second align key apart from the first align key, forming third and fourth align keys in the wafer, the third align key apart from the second align key, the fourth align key apart from the third align key, forming a fifth align key in the wafer, the fifth align key apart from the fourth align key, forming a first line pattern in the wafer using the second and third align keys, forming a second line pattern in the wafer using the fourth and fifth align keys, forming a first interposer including the first line pattern by cutting a space between the first and second align keys, and forming a second interposer, the second interposer including the second line pattern by cutting a space between the third and fourth align keys.

20 Claims, 14 Drawing Sheets

MB TSV 320 MD4 MD3 MD2 MD1 BD 1 200 dab pb1 cadb1 cadl cadb2 pb2 cdb dal 100 cdl 50 DAFB PBFB CDFB DAB PB CDB Z Y A-A'

(56) References Cited

U.S. PATENT DOCUMENTS

| | | | | |
|---|---|---|---|---|
| 9,915,869 | B1 | 3/2018 | Hisamura | |
| 2013/0320565 | A1 | 12/2013 | Griswold | |
| 2015/0332996 | A1 | 11/2015 | Kuo et al. | |
| 2017/0141812 | A1* | 5/2017 | Oikawa | H03K 19/20 |
| 2020/0243422 | A1* | 7/2020 | Kim | H01L 23/3107 |

* cited by examiner

SEMICONDUCTOR DEVICE AND METHOD OF FABRICATING THE SAME

This application claims priority to Korean Patent Application No. 10-2019-0132300, filed on Oct. 23, 2019, in the Korean Intellectual Property Office, and all the benefits accruing therefrom under 35 U.S.C. § 119, the disclosure of which is incorporated herein in its entirety by reference.

BACKGROUND

1. Technical Field

The present disclosure relates to semiconductor devices and methods of fabricating the same.

2. Description of the Related Art

An interposer may be used for signal connection between a plurality of semiconductor chips. For example, in the case of a high-bandwidth memory (HBM) device, a memory chip for storing data and a logic chip for providing a command to the memory chip may be electrically connected to each other through an interposer.

SUMMARY

Some aspects of the present disclosure provide methods of fabricating a semiconductor device, which includes an interposer having improved memory chip mounting efficiency.

Some aspects of the present disclosure also provide semiconductor devices including an interposer having improved memory chip mounting efficiency.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

In one embodiment, a method of fabricating a semiconductor device comprises forming a first align key and a second align key in a wafer, the second align key spaced apart from the first align key in a first direction by a first distance, forming a third align key and a fourth align key in the wafer, the third align key spaced apart from the second align key in the first direction by a second distance, the second distance greater than the first distance, the fourth align key spaced apart from the third align key in the first direction by the first distance, forming a fifth align key in the wafer, the fifth align key spaced apart from the fourth align key in the first direction by the second distance, forming a first line pattern in the wafer using the second align key and the third align key, forming a second line pattern in the wafer using the fourth align key and the fifth align key, forming a first interposer, the first interposer including the first line pattern by cutting a space between the first align key and the second align key in a second direction intersecting the first direction, and forming a second interposer, the second interposer including the second line pattern by cutting a space between the third align key and the fourth align key in the second direction.

In one embodiment, a method of fabricating a semiconductor device comprises providing an interposer, the interposer including a first direction edge portion, a second direction edge portion perpendicular to a first direction, and a line pattern, disposing a logic chip on the interposer, the logic chip being electrically connected to the line pattern, and disposing memory chips on the interposer, the memory chips being electrically connected to the line pattern, wherein the line pattern is not in the first direction edge portion and is in the second direction edge portion.

In one embodiment, a method of fabricating a semiconductor device comprises providing an interposer including a line pattern, disposing a logic chip at a center of an upper surface of the interposer, the logic chip being electrically connected to the line pattern, disposing a plurality of first memory chips on a first side of the logic chip aligned in a first direction, the first memory chips are electrically connected to the line pattern, and disposing a plurality of second memory chips on a second side of the logic chip opposite the first side aligned in the first direction, the second memory chips are electrically connected to the line pattern, wherein a length of the interposer in the first direction is 34 mm to 40 mm.

In one embodiment, a semiconductor device comprises an interposer including a first direction edge portion, a second direction edge portion perpendicular to a first direction, and a line pattern therein, a logic chip on the interposer and electrically connected to the line pattern, and memory chips on the interposer and electrically connected to the line pattern, wherein the line pattern is not in the first direction edge portion and is in the second direction edge portion.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Example embodiments according to the technical spirit of the present disclosure will now be described with reference to the attached drawings.

Figure 1:
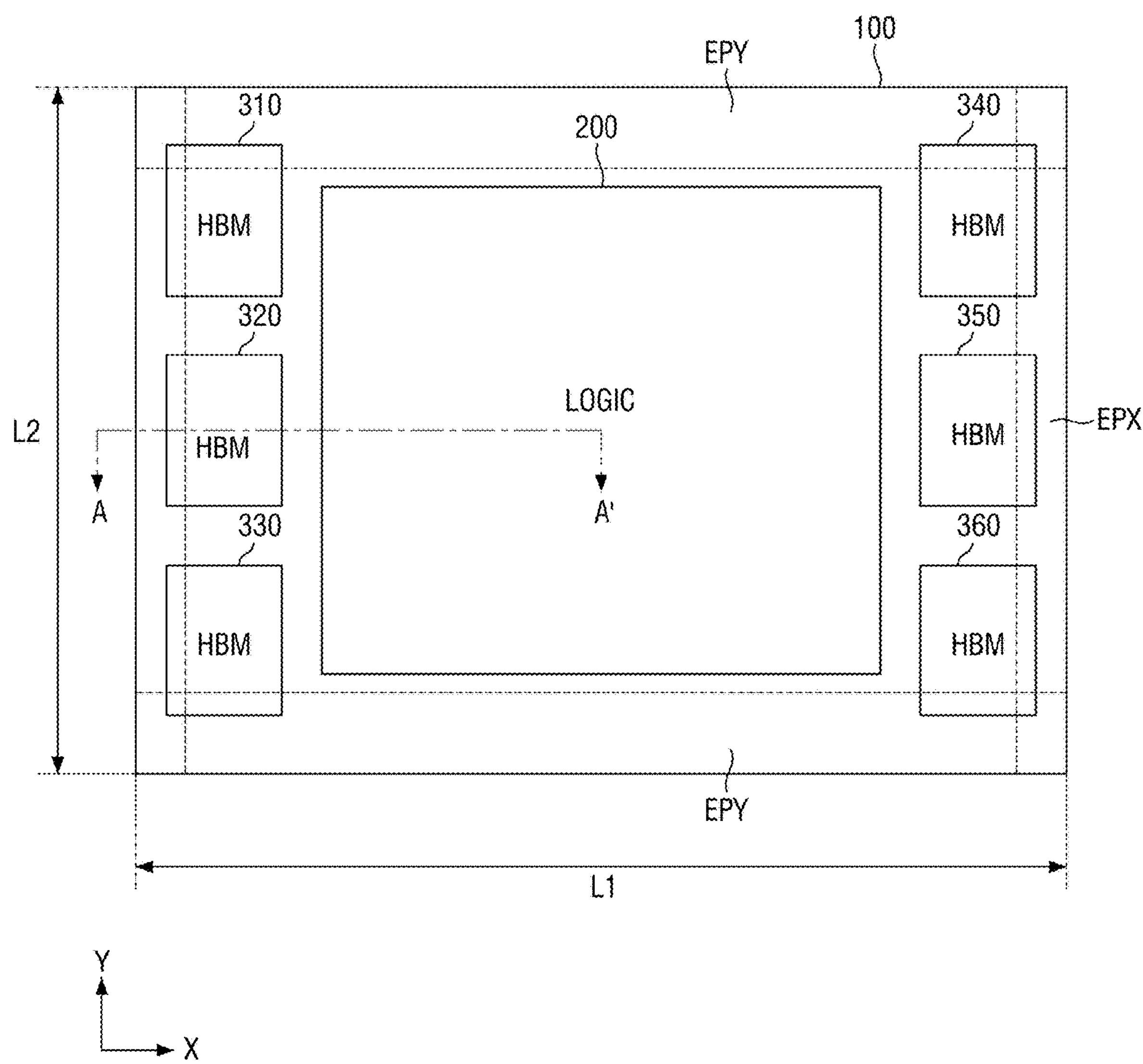
FIG. 1 is a plan view of a semiconductor device according to some example embodiments.
Figure 2:
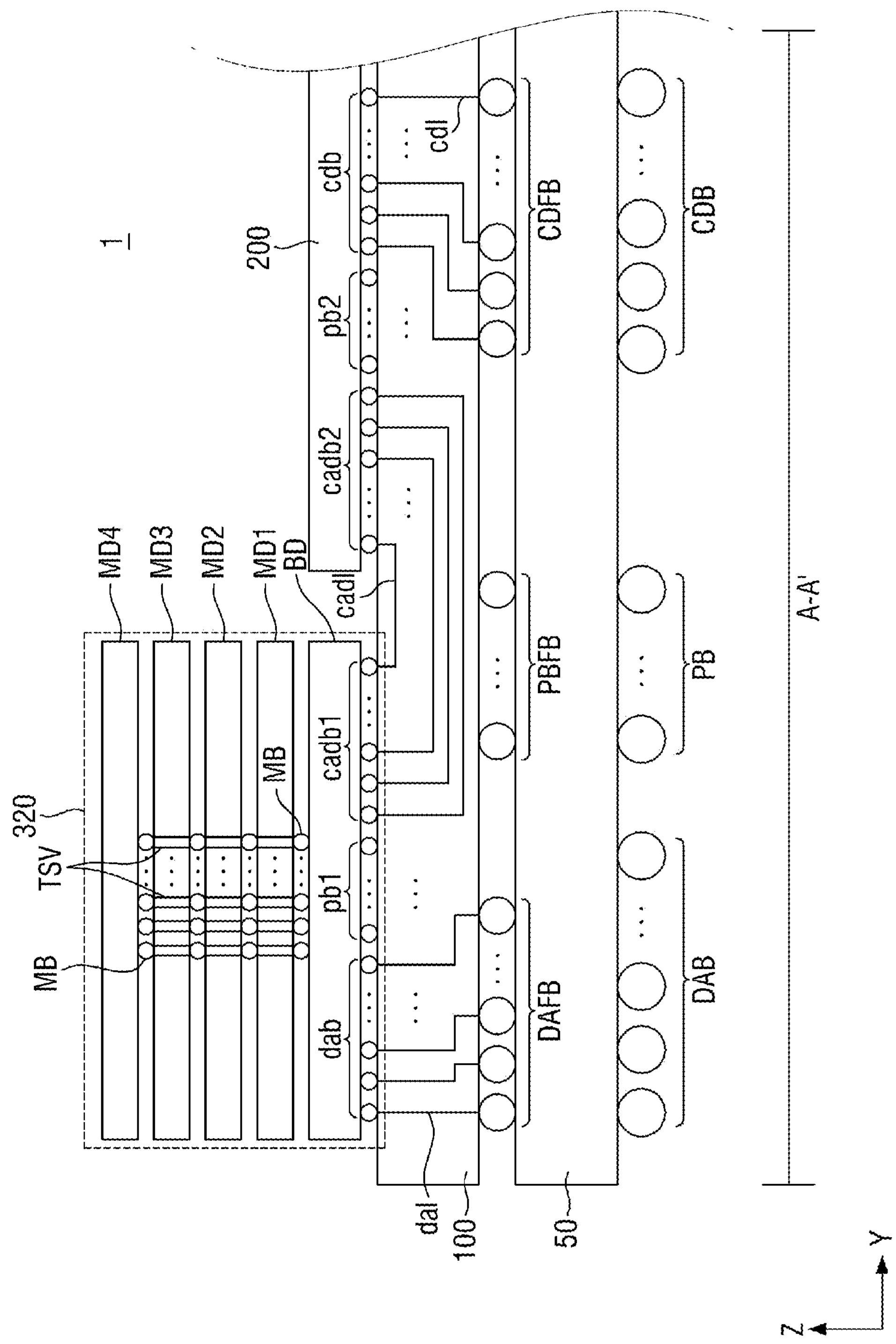
FIG. 2 is a cross-sectional view taken along line A-A' of FIG. 1.
Figure 3:
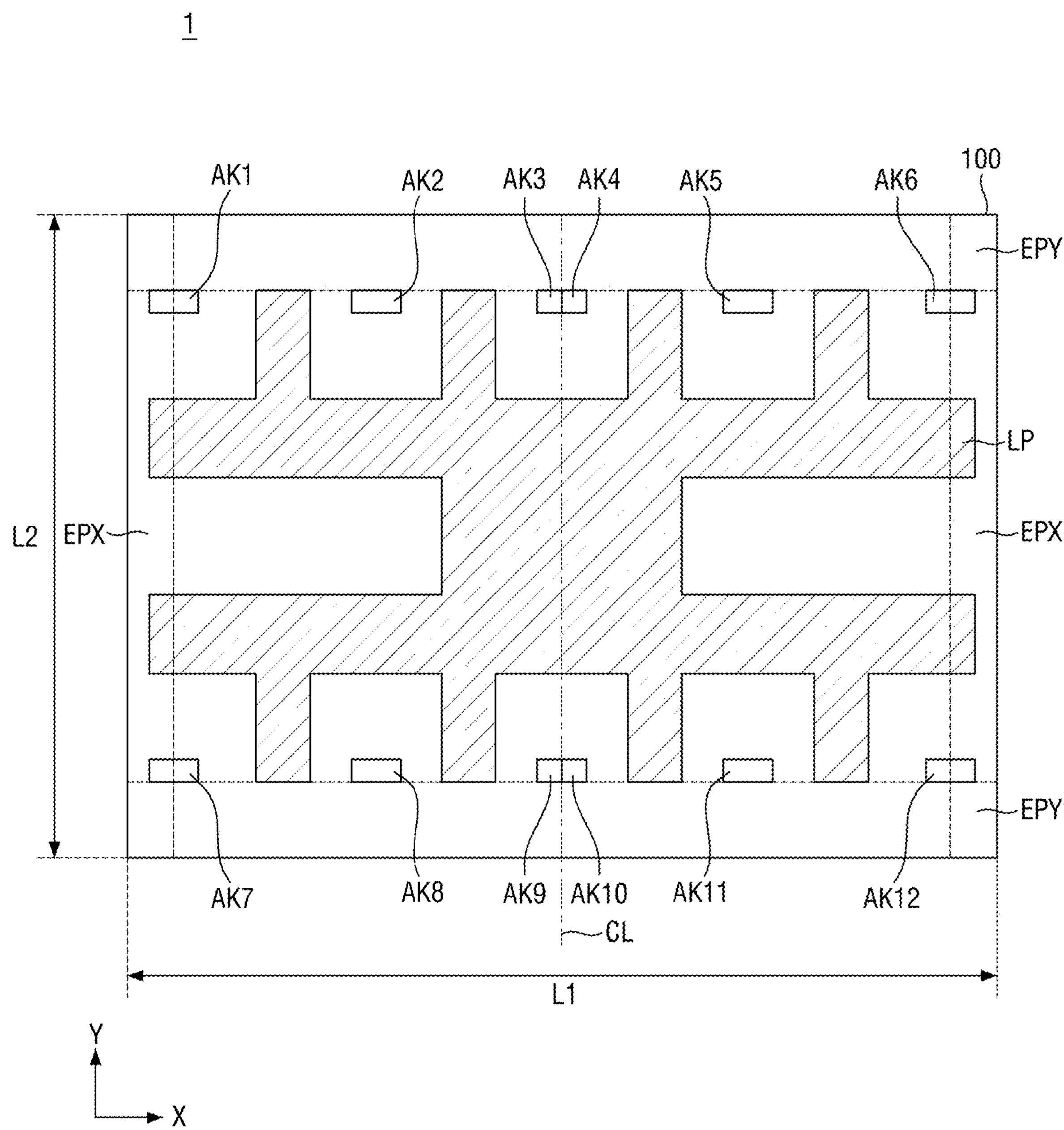
FIG. 3 is an example layout view of an interposer of FIG. 1.

FIG. 1 is a plan view of a semiconductor device 1 according to some example embodiments. FIG. 2 is a cross-sectional view taken along line A-A' of FIG. 1. FIG. 3 is an example layout view of an interposer 100 of FIG. 1.

Referring to FIGS. 1 to 3, the semiconductor device 1 may include a base substrate 50, the interposer 100, a logic chip 200, and memory chips 310 to 360.

Referring to FIG. 1, the memory chips 310 to 360 may be disposed on the interposer 100.

In some example embodiments, the memory chips 310 to 360 may include high-bandwidth memory (HBM) chips. For example, the semiconductor device 1 may be, but is not limited to, an HBM chip.

The interposer 100 may include edge portions EPY located in a first direction (Y direction, hereinafter indicated by Y) and edge portions EPX located in a second direction (X direction, hereinafter indicated by X). Hereinafter, elements referred to as first direction edge portions EPY refer to edge portions located in the first direction Y of the interposer 100, and elements referred to as second direction edge portions EPX refer to edge portions located in the second direction X of the interposer 100. The edge portions EPY and edge portions EPX may be the edge portions of the interposer 100 that are perpendicular to the first direction Y and second direction X, respectively.

The memory chips 310 to 360 may be disposed adjacent to the second direction edge portions EPX of the interposer 100. Specifically, the memory chips 310 to 330 may be disposed adjacent to a second direction edge portion EPX located on a left side of the interposer 100, and the memory chips 340 to 360 may be disposed adjacent to a second direction edge portion EPX located on a right side of the interposer 100.

The memory chips 310 to 330 may be aligned in the first direction Y, and the memory chips 340 to 360 may be aligned in the first direction Y.

At least a portion of each of the memory chips 310 and 340 located on an upper side of the interposer 100 may be disposed on a first direction edge portion EPY, and at least a portion of each of the memory chips 330 and 360 located on a lower side of the interposer 100 may be disposed on a first direction edge portion EPY.

In some example embodiments, three memory chips 310 to 330 may be disposed on a left side of an upper surface of the interposer 100, and three memory chips 340 to 360 may be disposed on a right side of the upper surface of the interposer 100. However, all of the six memory chips 310 to 360 are disposed within the upper surface of the interposer 100.

That is, a length L2 of the interposer 100 in the first direction Y is sufficient to accommodate three memory chips 310 to 330 on the left side of the upper surface of the interposer 100 and three memory chips 340 to 360 on the right side of the upper surface of the interposer 100. Accordingly, the memory chip mounting efficiency of the semiconductor device 1 may be improved.

If the length L2 of the interposer 100 in the first direction Y is not sufficiently long (e.g., if the first direction edge portions EPY do not exist), it may not be possible to place three memory chips 310 to 330 on the left side of the upper surface of the interposer 100 as illustrated in the drawing, and only two memory chips (e.g., 320 and 330) may be placed. In addition, it may not be possible to place three memory chips 340 to 360 on the right side of the upper surface of the interposer 100 as illustrated in the drawing, and only two memory chips (e.g., 350 and 360) may be placed. For example, the memory chip mounting efficiency of the semiconductor device 1 may be reduced.

In addition, if the length L2 of the interposer 100 in the first direction Y is not sufficiently long (e.g., if the first direction edge portions EPY do not exist), when three memory chips 310 to 330 are placed on the left side of the upper surface of the interposer 100 as illustrated in the drawing and three memory chips 340 to 360 are placed on the right side of the upper surface of the interposer 100 as illustrated in the drawing, at least a portion of each of the memory chips 310 and 340 placed on the upper side of the interposer 100 and at least a portion of each of the memory chips 330 and 360 placed on the lower side of the interposer 100 may protrude out of the interposer 100. For example, mounting stability may be reduced, which may result in vulnerability to external shock.

In some example embodiments, in order for the length L2 of the interposer 100 in the first direction Y to be sufficiently long, the length L2 of the interposer 100 in the first direction Y may be 34 mm to 40 mm.

When the length L2 of the interposer 100 in the first direction Y is 34 mm or more, it is possible to secure a sufficient space for placing three memory chips 310 to 330 on the left side of the upper surface of the interposer 100 as illustrated in the drawing and placing three memory chips 340 to 360 on the right side of the upper surface of the interposer 100 as illustrated in the drawing. If the length L2 of the interposer 100 in the first direction Y is smaller than 34 mm, it may not be possible to place three memory chips 310 to 330 on the left side of the upper surface of the interposer 100 as illustrated in the drawing and place three memory chips 340 to 360 on the right side of the upper surface of the interposer 100 as illustrated in the drawing.

The length L2 of the interposer 100 in the first direction Y may be 40 mm or less to maintain process yields. As will be described later, in some example embodiments, the interposer 100 may be formed by forming line patterns (e.g., LP1 and LP2 of FIG. 12) in a wafer (e.g., W of FIG. 12) and cutting the wafer into certain units. If the length L2 of the interposer 100 in the first direction Y exceeds 40 mm, it may not be possible to manufacture a large number of interposers 100 from one wafer.

In some example embodiments, the interposer 100 may be manufactured using a first main mask (e.g., MM1 of FIG. 8) and a second main mask (e.g., MM2 of FIG. 10), each substantially having a size of 26 mm (horizontal length)×33 mm (vertical length). That is, while the vertical lengths of the main masks used to manufacture the interposer 100 are 33 mm, the vertical length of the interposer 100 may be made greater than 33 mm to secure a sufficient space for placing three memory chips 310 to 330 on the left side of the upper surface of the interposer 100 and placing three memory chips 340 to 360 on the right side of the upper surface of the interposer 100.

In some example embodiments, a length L1 of the interposer 100 in the second direction X may be 50 mm to 54 mm.

The length L1 of the interposer 100 in the second direction X may be 50 mm or more to secure a sufficient space for placing the three memory chips 310 to 330, the logic chip 200, and the three memory chips 340 to 360 on the upper surface of the interposer 100 in the second direction X as illustrated in the drawing. If the length L1 of the interposer 100 in the second direction X is smaller than 50 mm, it may not be possible to place the three memory chips 310 to 330, the logic chip 200, and the three memory chips 340 to 360 in the second direction X.

The length L1 of the interposer 100 in the second direction X may be 54 mm or less to maintain process yields. As described above, the interposer 100 may be formed by cutting a wafer into certain units. Thus, if the length L1 of the interposer 100 in the second direction X exceeds 54 mm, it may not be possible to manufacture a large number of interposers 100 from one wafer.

As described above, the interposer 100 may be manufactured using the first main mask (e.g., MM1 of FIG. 8) and the second main mask (e.g., MM2 of FIG. 10), each substantially having a size of 26 mm (horizontal length)×33 mm (vertical length). Here, line patterns (e.g., LP1 and LP2 of FIG. 12) may be formed to partially overlap each other using the first main mask and the second main mask, so that the length L1 of the interposer 100 in the second direction X is smaller than 52 mm which is the sum of the horizontal lengths of the first main mask and the second main mask. This will be described in more detail later.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

The logic chip 200 may be disposed at a center of the upper surface of the interposer 100. The logic chip 200 may control the memory chips 310 to 360.

Since the logic chip 200 is disposed at the center of the upper surface of the interposer 100, the memory chips 310 to 330 may be disposed on a left side of the logic chip 200, and the memory chips 340 to 360 may be disposed on a right side of the logic chip 200.

Referring to FIG. 2, the memory chip 320 may include memory dies MD1 to MD4 and a base die BD (or a buffer die). The memory dies MD1 to MD4 and the base die BD may be sequentially stacked as illustrated in FIG. 2.

The memory dies MD1 to MD4 may be stacked on the base die BD. First bumps MB may be disposed between the stacked memory dies MD1 to MD4 and the base die BD, and through silicon vias TSV may electrically connect the first bumps MB to each other and penetrate the memory dies MD1 to MD4.

A conductive through electrode may be disposed in each of the through silicon vias TSV. The through electrode may include, but is not limited to, at least one of, e.g., aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), and zirconium (Zr).

First direct access (DA) bumps dab, first power bumps pb1, and first command and address bumps and data bumps cadb1 may be disposed on a lower surface of the base die BD.

Although only the memory chip 320 is illustrated in FIG. 2, the other memory chips 310, 330, 340, 350 and 360 may also have the same structure as the illustrated structure.

Second command and address bumps and data bumps cadb2, second power bumps pb2, and first control signal and data bumps cdb may be disposed on a lower surface of the logic chip 200.

The logic chip 200 may be a graphic processing unit (GPU) die, a central processing unit (CPU) die, or a system on chip (SoC).

The first bumps MB, the first DA bumps dab, the first and second power bumps pb1 and pb2, the first and second command and address bumps and data bumps cadb1 and cadb2, and the first control signal and data bumps cdb may be, but are not limited to, micro-bumps.

Second DA bumps DAFB, third power bumps PBFB, and second control signal and data bumps CDFB may be disposed on a lower surface of the interposer 100.

The second DA bumps DAFB, the third power bumps PBFB, and the second control signal and data bumps CDFB may include, but are not limited to, at least one of, e.g., tin (Sn), indium (In), lead (Pb), zinc (Zn), nickel (Ni), gold (Au), silver (Ag), copper (Cu), antimony (Sb), bismuth (Bi), and combinations thereof.

The interposer 100 may include DA lines dal connecting the first DA bumps dab and the second DA bumps DAFB, command and address lines and data lines cadl connecting the first command and address bumps and data bumps cadb1 and the second command and address bumps and data bumps cadb2, and control signal and data lines cdl connecting the first control signal and data bumps cdb and the second control signal and data bumps CDFB.

Although not specifically illustrated, the interposer 100 may additionally include power lines connecting the first power bumps pb1 and the third power bumps PBFB and connecting the second power bumps pb2 and the third power bumps PBFB.

The interposer 100 may include, but is not limited to, at least one of silicon, glass, ceramic, and plastic.

The second DA bumps DAFB, the third power bumps PBFB, and the second control signal and data bumps CDFB may be, but are not limited to, flip die bumps.

DA balls DAB, power balls PB, and control signal and data balls CDB may be disposed on a lower surface of the base substrate 50.

The DA balls DAB, the power balls PB, and the control signal and data balls CDB may include, but are not limited to, at least one of, e.g., tin (Sn), indium (In), lead (Pb), zinc (Zn), nickel (Ni), gold (Au), silver (Ag), copper (Cu), antimony (Sb), bismuth (Bi), and combinations thereof.

In the base substrate 50, the second DA bumps DAFB may be connected to the DA balls DAB, the third power bumps PBFB may be connected to the power balls PB, and the second control signal and data bumps CDFB may be connected to the control signal and data balls CDB.

The base substrate 50 may be, but is not limited to, a printed circuit board (PCB) or a ceramic substrate.

When the base substrate 50 is a PCB, it may be made of at least one material selected from phenolic resin, epoxy resin, and polyimide. For example, the base substrate 50 may include at least one material selected from FR4, tetrafunctional epoxy, polyphenylene ether, epoxy/polyphenylene oxide, bismaleimide triazine (BT), thermount, cyanate ester, polyimide, and liquid crystal polymer. A surface of the base substrate 50 may be covered by solder resist, but the technical spirit of the inventive concepts is not limited to this case.

The logic chip 200 may process data in response to a control signal received through the second control signal and data bumps CDFB, generate the processed data as channel data, and transmit the channel data to the base die BD through the first command and address bumps and data bumps cadb1, together with channel commands and addresses.

Referring to FIGS. 1 to 3, the interposer 100 may include therein a line pattern LP electrically connected to the memory chips 310 to 360 and the logic chip 200. Although an example of the line pattern LP is illustrated in FIG. 3, the shape of the line pattern LP is not limited to the illustrated shape. In addition, although the line pattern LP is symmetrical with respect to a center line CL that bisects the interposer 100, embodiments are not limited to this example. The example embodiment of the line pattern LP illustrated in FIG. 3 is only for ease of description and does not limit the scope of embodiments according to the technical spirit of the present disclosure.

The line pattern LP may correspond to the DA lines dal connecting the first DA bumps dab and the second DA bumps DAFB, the command and address lines and data lines cadl connecting the first command and address bumps and data bumps cadb1 and the second command and address bumps and data bumps cadb2, and the control signal and data lines cdl connecting the first control signal and data bumps cdb and the second control signal and data bumps CDFB.

The line pattern LP may be disposed in the second direction edge portions EPX of the interposer 100 but may not be disposed in the first direction edge portions EPY of the interposer 100. In other words, the line pattern LP of the interposer 100 may extend from a central portion of the interposer 100 to the second direction edge portions EPX but may not extend to the first direction edge portions EPY.

The reason why the line pattern LP electrically connected to the memory chips 310 to 360 and the logic chip 200 is not disposed in the first direction edge portions EPY of the interposer 100 is because the interposer 100 is manufactured by cutting an area where the line pattern LP is not formed in a wafer along the second direction X when the interposer 100 is manufactured from the wafer through a cutting process. This will be described in more detail later.

Align keys AK1 to AK12 may be disposed in the interposer 100. The align keys AK1 to AK12 may be used in a process of forming the line pattern LP in a wafer and cutting the wafer.

Although twelve align keys AK1 to AK12 are illustrated in FIG. 3, embodiments are not limited to this case. In some example embodiments, the number of the align keys AK1 to AK12 disposed in the interposer 100 may be less than twelve. Alternatively, in some example embodiments, the number of the align keys AK1 to AK12 disposed in the interposer 100 may be greater than twelve. Alternatively, in some example embodiments, there may be no trace of the align keys AK1 to AK12 in the interposer 100.

The align key AK3 may be disposed adjacent to the align key AK4 with respect to the center line CL, and the align key AK9 may be disposed adjacent to the align key AK10 with respect to the center line CL. The align keys AK3, AK4, AK9 and AK10 are disposed as described above because portions of the line pattern LP adjacent to the center line CL are formed to overlap each other using two masks in the process of forming the line pattern LP.

Figure 4:
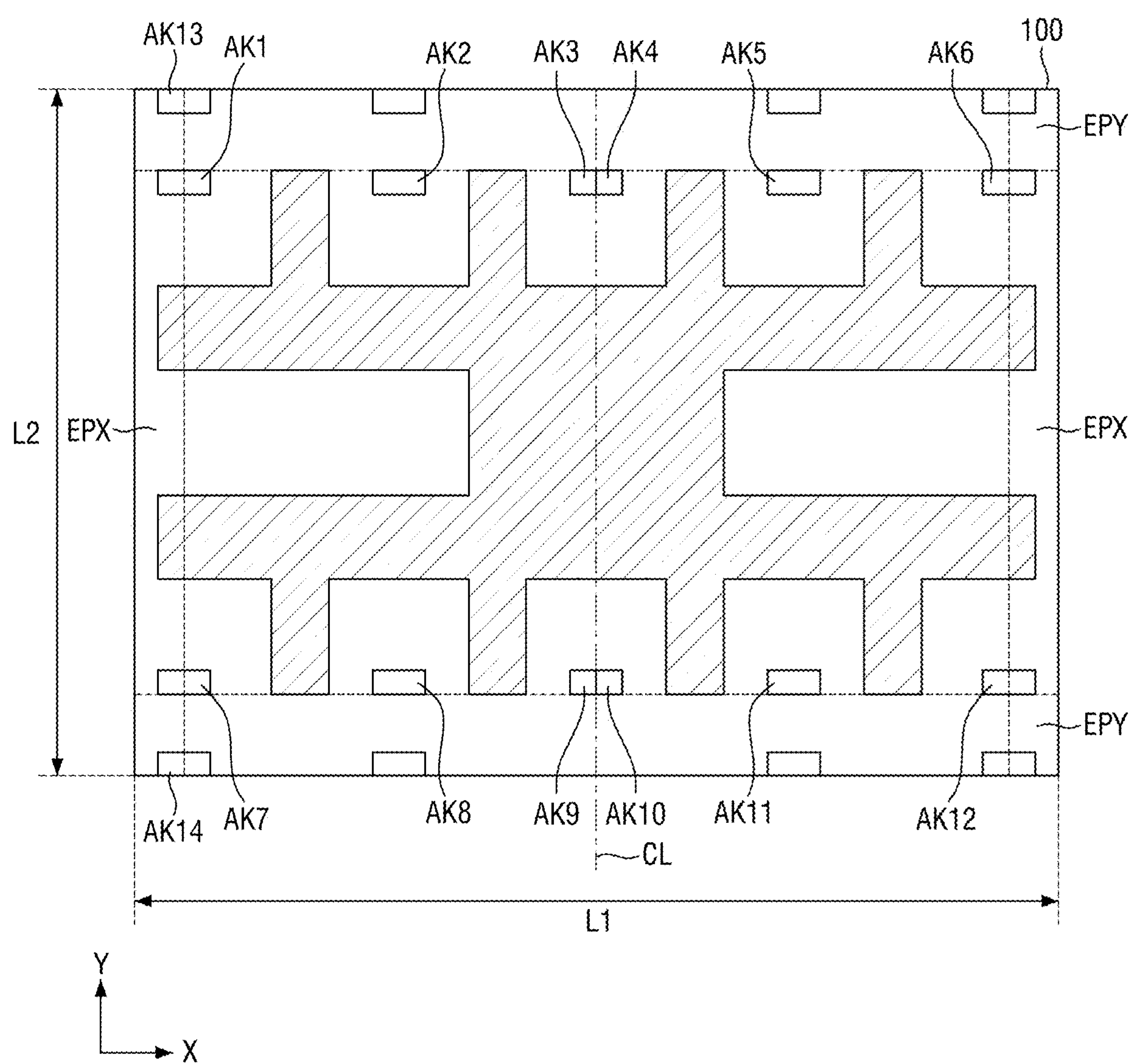
FIG. 4 is an example layout view of an interposer according to some example embodiments.

FIG. 4 is an example layout view of an interposer 100 according to some example embodiments.

In the following description, a description of elements and features identical to those of the above-described example embodiments will be omitted, and differences will be mainly described.

Referring to FIG. 4, align keys AK13 and AK14 may be disposed in first direction edge portions EPY of the interposer 100 of a semiconductor device 2. The align keys AK13 and AK14 may be used in a wafer cutting process. This will be described in detail later.

A method of fabricating a semiconductor device according to embodiments will now be described with reference to FIGS. 5 to 12.

Figure 5:
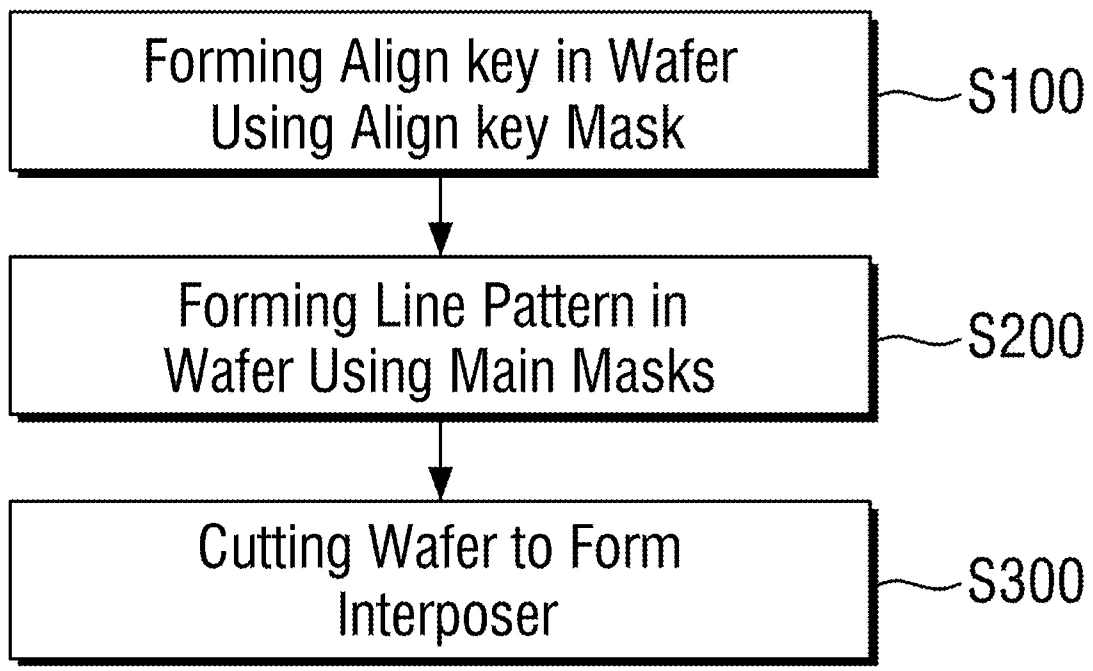
FIG. 5 is a flowchart illustrating a method of fabricating a semiconductor device according to some example embodiments.

FIG. 5 is a flowchart illustrating a method of fabricating a semiconductor device according to some example embodiments. FIGS. 6 to 12 are views for explaining the method of fabricating a semiconductor device according to some example embodiments.

First, referring to FIG. 5, align keys are formed in a wafer using an align key mask (operation S100).

Figure 6:
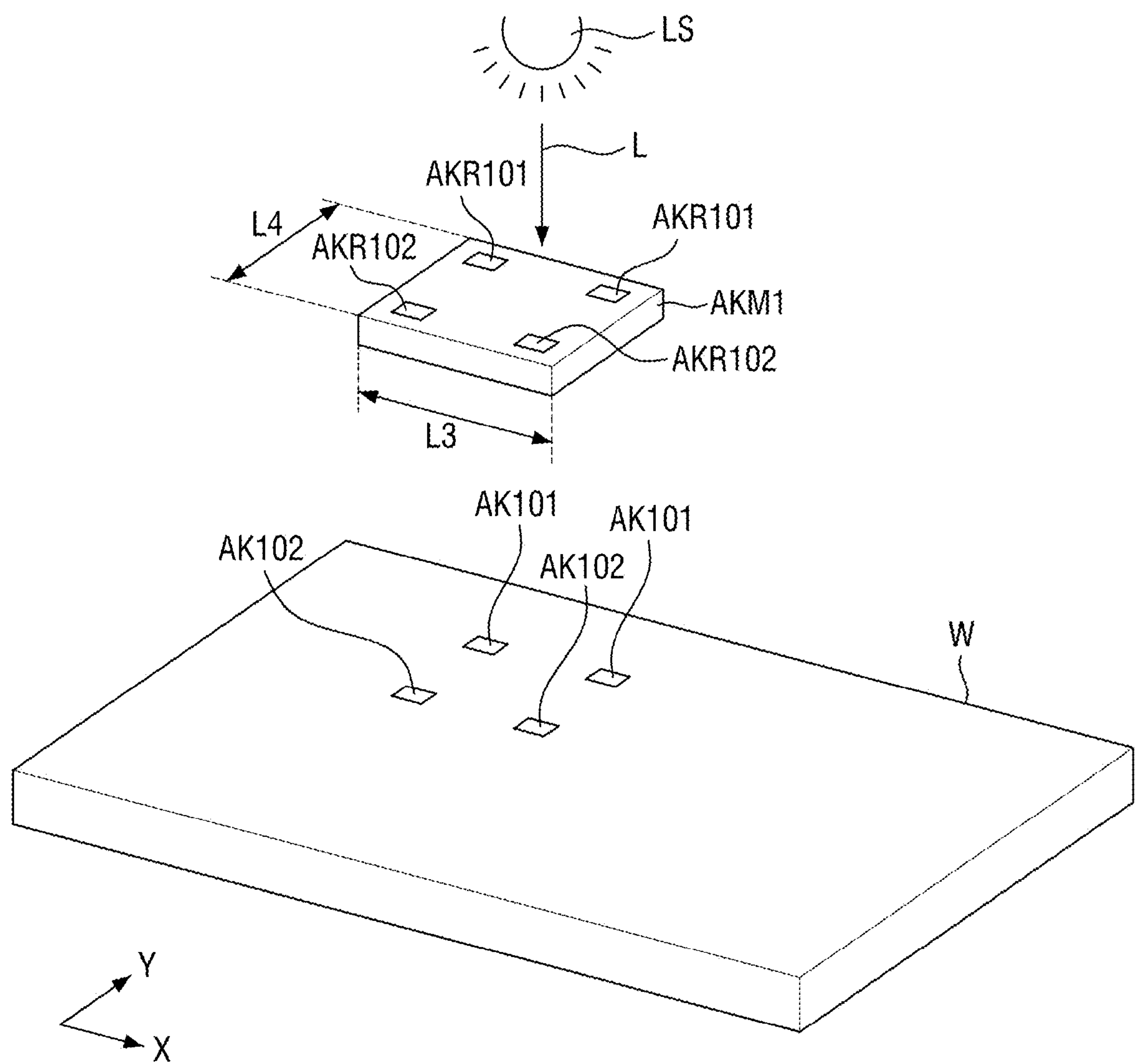
FIGS. 6 to 12 are views for explaining the method of fabricating a semiconductor device according to some example embodiments.

Referring to FIG. 6, an align key mask AKM1 may include align key recesses AKR101 and AKR102. The align key recesses AKR101 and AKR102 may be patterned in the align key mask AKM1 to form align keys AK101 and AK102 in a wafer W.

Light provided from a light source LS may be transmitted through the align key mask AKM1 to form the align keys AK101 and AK102 in the wafer W through a photo or exposure process.

In some example embodiments, a length L4 of the align key mask AKM1 in the first direction Y may be different from a length L3 of the align key mask AKM1 in the second direction X.

Figure 7:
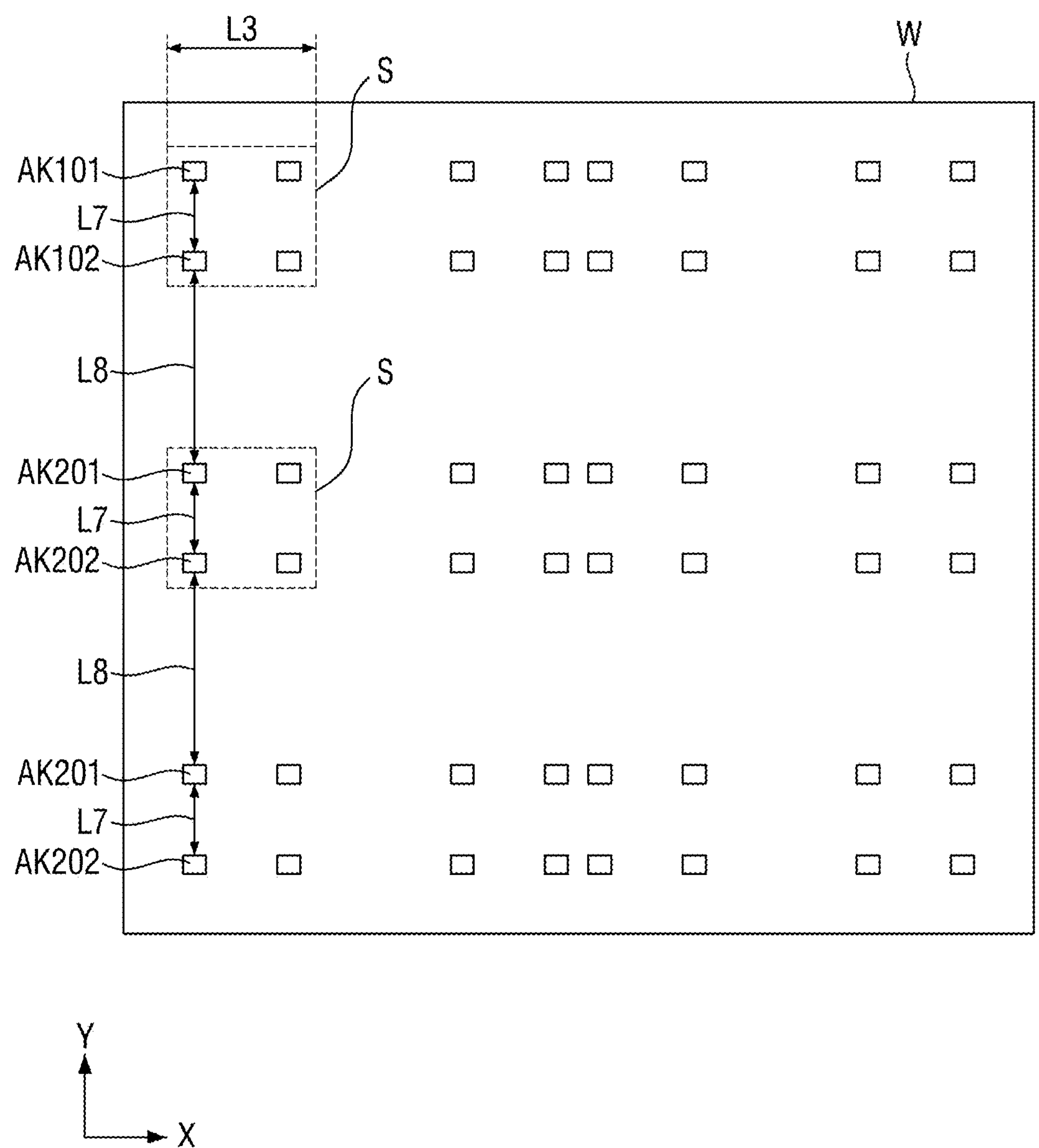

Referring to FIG. 7, a plurality of align keys AK101 and AK102 may be formed in the wafer W through a plurality of photo or exposure processes.

In one photo or exposure process (one shot S), four align keys AK101 and AK102 may be formed in the wafer W, that is two align keys AK101 and two align keys 102 may be formed.

A distance L7 in the first direction Y between align keys AK101 and AK102 formed by one shot S may be proportional to the length L4 of the align key mask AKM1 in the first direction Y described above with reference to FIG. 6.

After the align keys AK101 and AK102 are formed, align keys AK201 and AK202 are formed at a position spaced apart from the align keys AK101 and AK102 in the first direction Y. The align keys AK201 and AK202 may also be formed using the align key mask AKM1 illustrated in FIG. 6.

Here, the align keys AK201 and AK202 are formed such that a distance L8 between the align key AK201 and the align key AK102 is greater than the distance L7 between the align key AK101 and the align key AK102.

In other words, after the align keys AK101 and AK102 are formed in one shot S, the align keys AK201 and AK202 may be formed in a next shot S at a position where the distance L8 between the align key AK201 and the align key AK102 becomes greater than the distance L7 between the align key AK101 and the align key AK102.

Here, the distance L8 between the align key AK201 and the align key AK102 may be proportional to a length L5 of a first main mask MM1 in the first direction Y which will be described later with reference to FIG. 8. The length L5 of the first main mask MM1 in the first direction Y may be greater than the length L4 of the align key mask AKM1 in the first direction Y, and the distance L8 between the align key AK201 and the align key AK102 may be greater than the distance L7 between the align key AK101 and the align key AK102.

After the align keys AK201 and AK202 are formed, additional align keys AK201 and AK202 may be formed at a position spaced apart from the align keys AK201 and AK202 in the first direction Y. The align keys AK201 and AK202 may also be formed using the align key mask AKM1 illustrated in FIG. 6.

By repeating the above process, a plurality of align keys AK101, AK102, AK201 and AK202 may be formed in the wafer W of FIG. 7.

Referring again to FIG. 5, a line pattern is formed in the wafer using main masks (operation S200).

Figure 8:
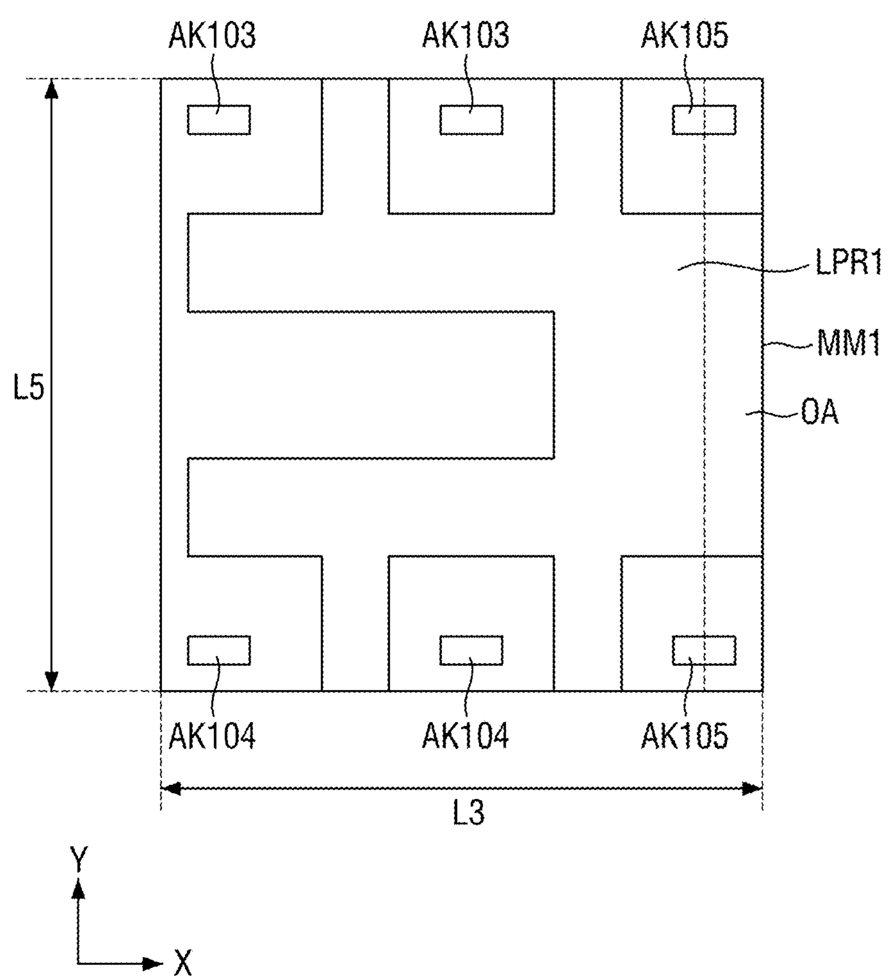
Figure 9:
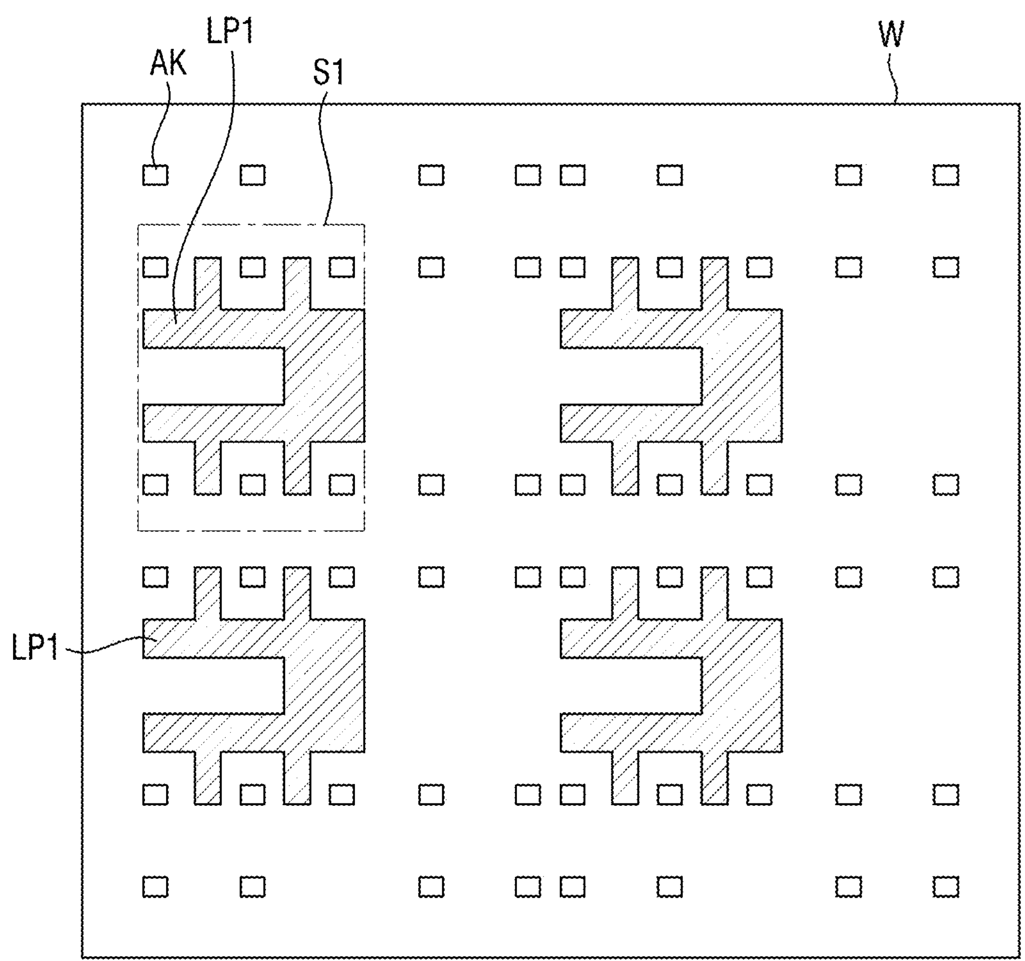

Referring to FIGS. 7 to 9, a first line pattern LP1 may be formed in the wafer W using the first main mask MM1 having a first line pattern recess LPR1.

Here, the first line pattern LP1 may be formed in the wafer W using align keys AK103, AK104 and AK105 of the first main mask MM1 and the align keys AK101, AK102, AK201 and AK202 formed in the wafer W.

Specifically, the first line pattern LP1 may be formed in the wafer W by aligning the align keys AK103 of the first main mask MM1 with the align keys AK102 of the wafer W and aligning the align keys AK104 of the first main mask MM1 with the align keys AK201 of the wafer W.

Accordingly, as illustrated in FIG. 9, the first line pattern LP1 may be formed in the wafer W in each shot S1.

The align keys AK105 of the first main mask MM1 may be used for alignment with align keys AK106 (see FIG. 10) of a second main mask MM2 (see FIG. 10) which will be described later. The align keys AK105 of the first main mask MM1 and the align keys AK106 of the second main mask MM2 may be in the same position.

The first line pattern recess LPR1 of the first main mask MM1 may include an overlap area OA. The overlap area OA may be an area where, after the first line pattern LP1 is formed in the wafer W using the first main mask MM1, a second line pattern LP2 is also formed in the wafer W using the second main mask MM2 (see FIG. 10) to be described later.

In some example embodiments, the length L5 of the first main mask MM1 in the first direction Y may be different from a length L3 of the first main mask MM1 in the second direction X. In some example embodiments, the length L3 may be about 26 mm, and the length L5 may be about 33 mm.

In some example embodiments, the length L5 of the first main mask MM1 in the first direction Y may be greater than the length L4 of the align key mask AKM1 in the first direction Y. For example, the length L4 of the align key mask AKM1 in the first direction Y may be less than 33 mm.

In some example embodiments, the length L3 of the first main mask MM1 in the second direction X may be greater than the length L3 of the align key mask AKM1 in the second direction X. For example, the length L3 of the align key mask AKM1 in the second direction X may be less than 26 mm.

In some example embodiments, the length L3 of the first main mask MM1 in the second direction X may be substantially equal to the length L3 of the align key mask AKM1 in the second direction X.

In some example embodiments, the first main mask MM1 may be larger in size than the align key mask AKM1.

Figure 10:
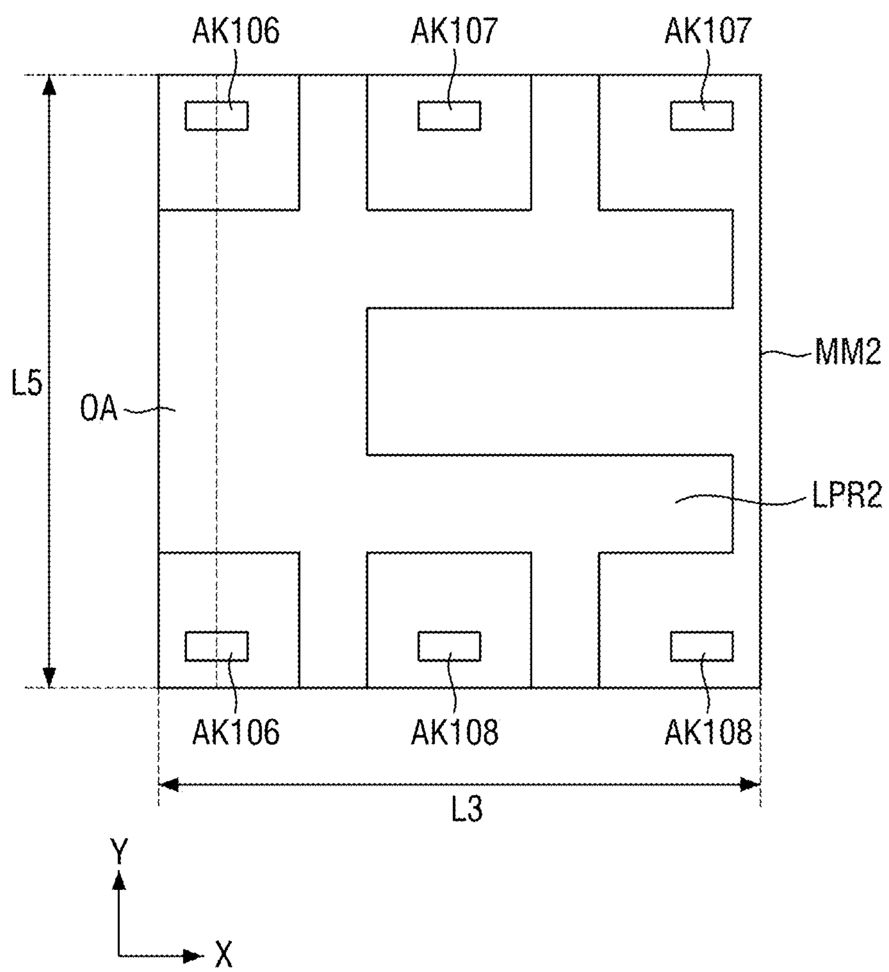
Figure 11:
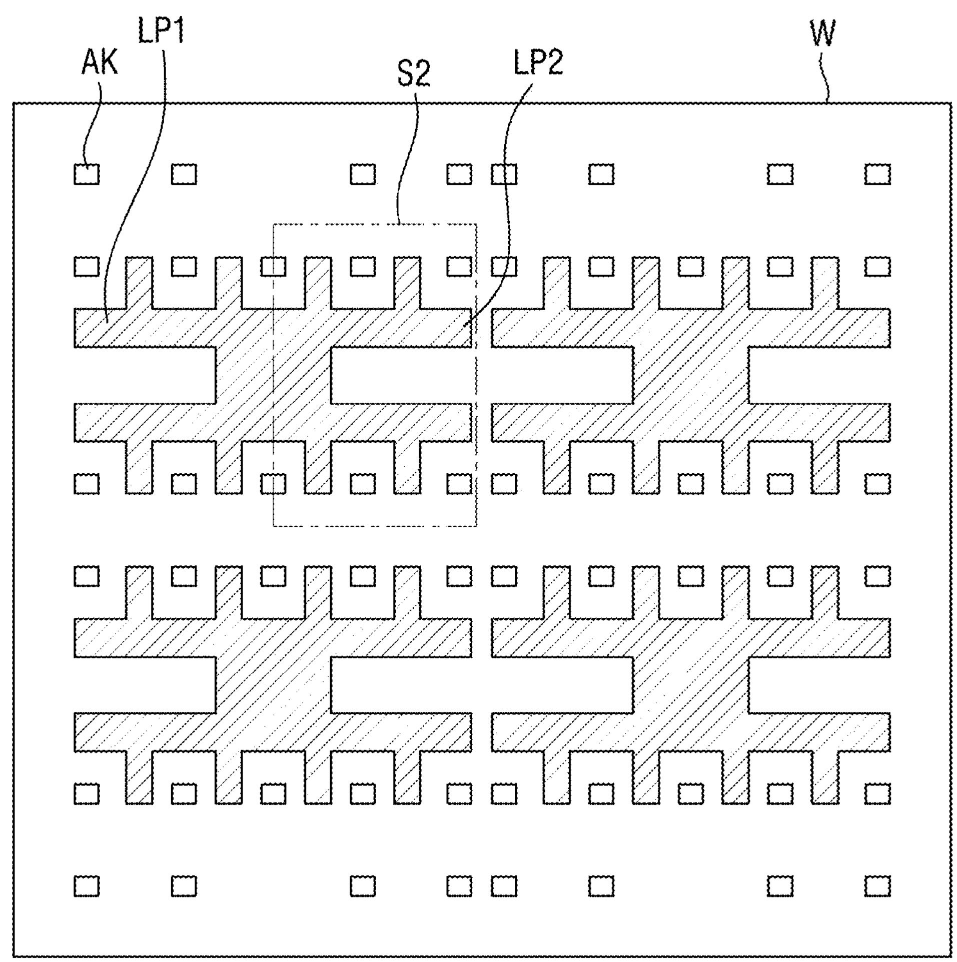

Referring to FIGS. 7, 10 and 11, the second line pattern LP2 may be formed in the wafer W using the second main mask MM2 having a second line pattern recess LPR2.

Here, the second line pattern LP2 may be formed in the wafer W using align keys AK106, AK107 and AK108 of the second main mask MM1 and the align keys AK101, AK102, AK201 and AK202 formed in the wafer W.

Specifically, the second line pattern LP2 may be formed in the wafer W by aligning the align keys AK107 of the second main mask MM2 with the align keys AK102 of the wafer W and aligning the align keys AK108 of the second main mask MM2 with the align keys AK201 of the wafer W.

Accordingly, as illustrated in FIG. 11, the second line pattern LP2 may be formed in the wafer W in each shot S2.

The align keys AK106 of the second main mask MM2 may be used for alignment with the align keys AK105 (see FIG. 8) of the first main mask MM1 (see FIG. 8).

The second line pattern recess LPR2 of the second main mask MM2 may include an overlap area OA. The overlap area OA may be an area where, after the first line pattern LP1 is formed in the wafer W using the first main mask MM1, the second line pattern LP2 is also formed in the wafer W using the second main mask MM2. Accordingly, as illustrated in FIG. 11, the align keys AK105 of the first main mask MM1 (see FIG. 8) and the align keys AK106 of the second main mask MM2 may overlap in the overlap area OA. However, depending some example embodiments, alignment may also be made such that the align keys AK105 and AK106 do not remain in the wafer W.

In some example embodiments, the second main mask MM2 may be substantially the same size as the first main mask MM1 (see FIG. 8) described above.

Referring again to FIG. 5, the wafer is cut to form interposers (operation S300).

Figure 12:
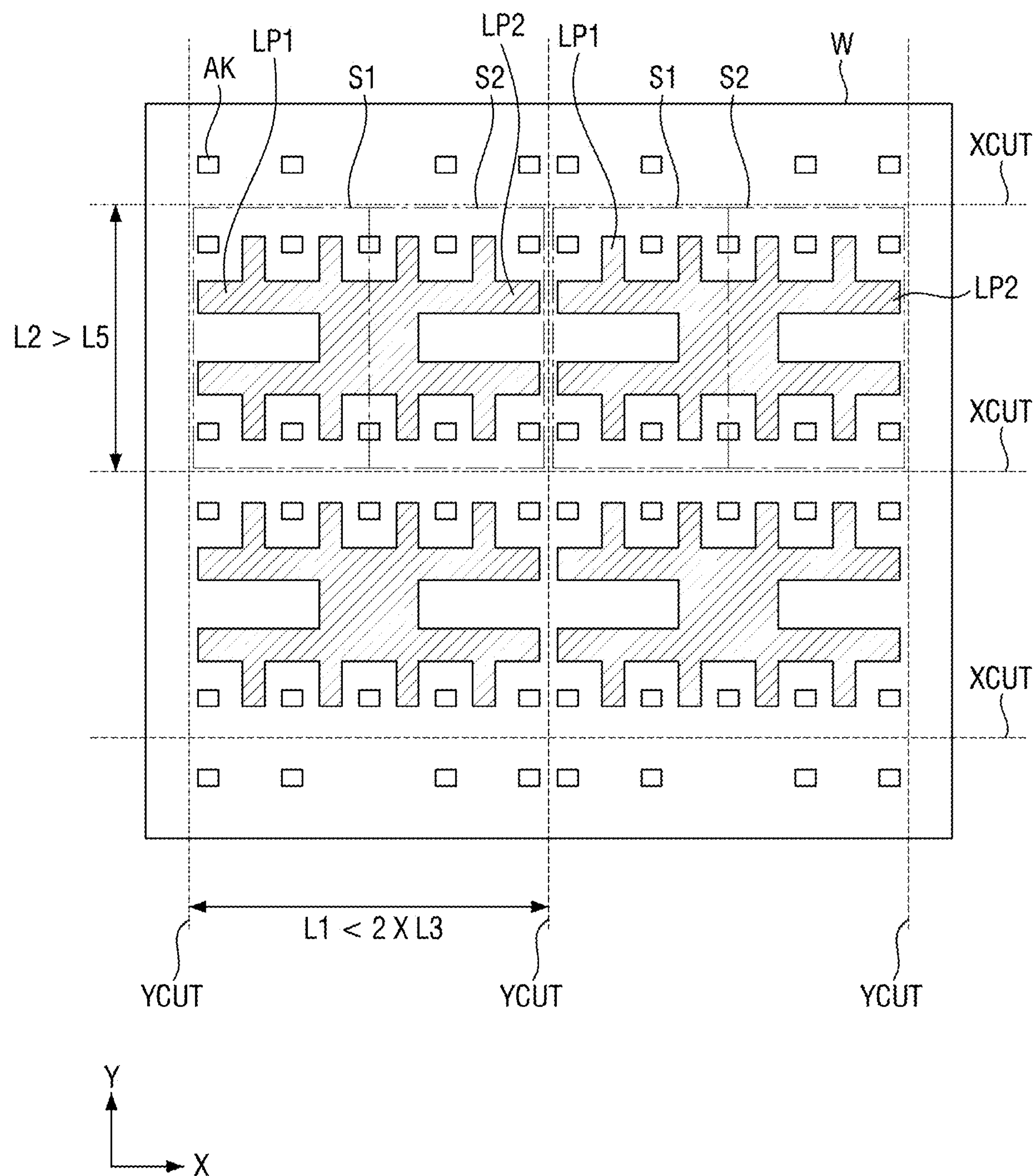

Referring to FIG. 12, the wafer W is cut along first direction cutting lines YCUT and along second direction cutting lines XCUT. Here, each of the first direction cutting lines YCUT may coincide with a boundary between a shot S2 and a shot S1, but each of the second direction cutting lines XCUT does not coincide with the boundary between the shot S2 and the shot S1.

That is, in the wafer W illustrated in FIG. 12, the line patterns LP1 and LP2 formed by the shots S1 and S2 are disposed adjacent to each other in the second direction X but are spaced apart from each other in the first direction Y.

The wafer W may be cut along this space (e.g., a space between the align keys AK) such that a length L2 of an interposer 100 in the first direction Y is greater than the lengths L5 of the first and second main masks MM1 and MM2 in the first direction Y. In other words, the size of the interposer 100 may be increased in the first direction Y to be greater than a predetermined shot size (e.g., 26 mm (horizontal length)×33 mm (vertical length)). Accordingly, it is possible to secure a sufficient space for placing the memory chips 310 to 360 described above.

Due to the overlap area OA (see FIGS. 8 and 10) described above, a length L1 of the interposer 100 in the second direction X may be less than the sum of the lengths L3 of the first and second main masks MM1 and MM2 in the second direction X.

In some example embodiments, if the overlap area OA (see FIGS. 8 and 10) described above does not exist, the length L1 of the interposer 100 in the second direction X may be designed to be greater than the sum of the lengths L3 of the first and second masks MM1 and MM2 in the second direction X in consideration of a cutting margin of the wafer W.

Next, a method of fabricating a semiconductor device according to embodiments will be described with reference to FIGS. 13 and 14.

Figure 13:
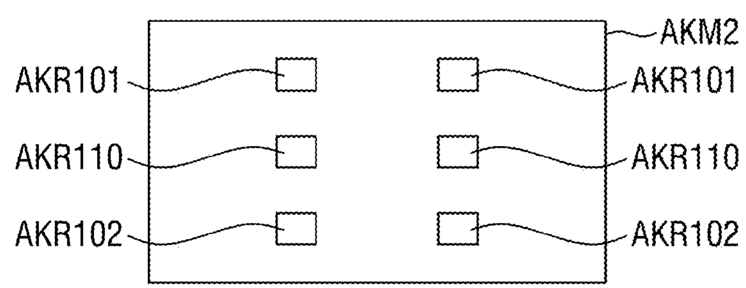
FIGS. 13 and 14 are views for explaining a method of fabricating a semiconductor device according to some example embodiments.
Figure 14:
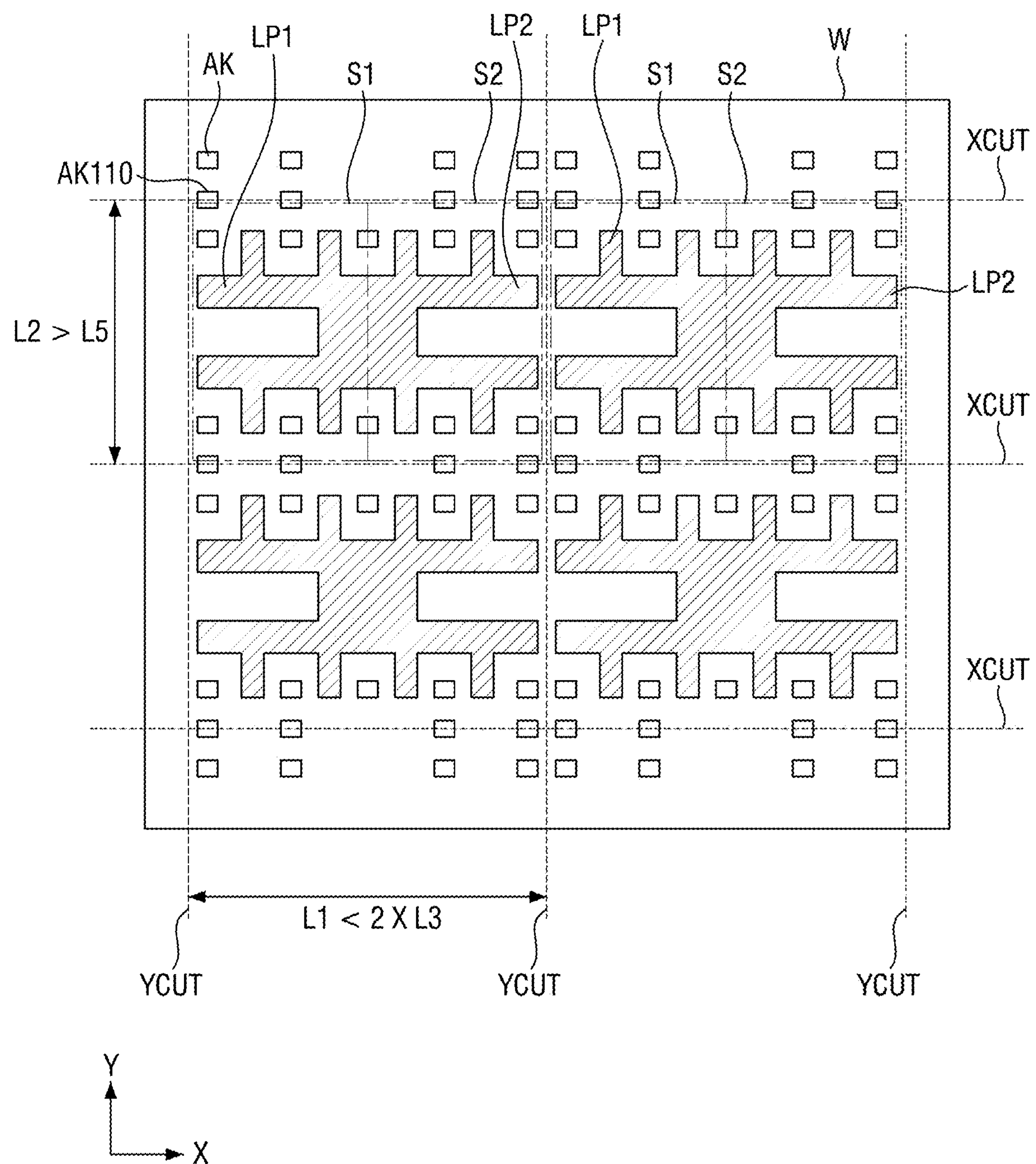

FIGS. 13 and 14 are views for explaining a method of fabricating a semiconductor device according to some example embodiments. The following description will focus on differences from the above-described embodiments.

Referring to FIGS. 13 and 14, an align key mask AKM2 according to some example embodiments may further include align key recesses AKR110 in addition to align key recesses AKR101 and AKR102. The align key recesses AKR101, AKR102 and AKR110 are patterned in the align key mask AKM2 to form align keys AK101, AK102 and AK110.

In some example embodiments, a wafer W is cut in the second direction X by using the align keys AK110 formed in the wafer W. Accordingly, the align keys AK110 that are partially cut may be disposed in the interposer 100 as illustrated in FIG. 4.

An interposer of a semiconductor device according to embodiments has a length long enough in a first direction to accommodate all three memory chips on each of left and right sides of an upper surface of the interposer. Accordingly, the memory chip mounting efficiency of the semiconductor device can be improved.

However, the effects of the present disclosure are not restricted to the one set forth herein. The above and other effects of the present disclosure will become more apparent to one of daily skill in the art to which the present disclosure pertains by referencing the claims.

What is claimed is:

1. A method of fabricating a semiconductor device, the method comprising:

forming a first align key and a second align key in a wafer, the second align key spaced apart from the first align key in a first direction by a first distance;

forming a third align key and a fourth align key in the wafer, the third align key spaced apart from the second align key in the first direction by a second distance, the second distance greater than the first distance, the fourth align key spaced apart from the third align key in the first direction by the first distance;

forming a fifth align key in the wafer, the fifth align key spaced apart from the fourth align key in the first direction by the second distance;

forming a first line pattern in the wafer using the second align key and the third align key;

forming a second line pattern in the wafer using the fourth align key and the fifth align key;

forming a first interposer, the first interposer including the first line pattern by cutting a space between the first align key and the second align key in a second direction intersecting the first direction; and forming a second interposer, the second interposer including the second line pattern by cutting a space between the third align key and the fourth align key in the second direction.

2. The method of claim 1, wherein the first to fifth align keys are formed using a first mask having a first size, and the first and second line patterns are formed using a second mask having a second size, the second size is greater than the first size.

3. The method of claim 2, wherein a length of the first mask in the first direction and a length of the second mask in the first direction are different from each other.

4. The method of claim 3, wherein the length of the first mask in the first direction is smaller than the length of the second mask in the first direction.

5. The method of claim 2, wherein a length of the first interposer in the first direction and the length of the second mask in the first direction are different from each other.

6. The method of claim 5, wherein the length of the first interposer in the first direction is greater than the length of the second mask in the first direction.

7. The method of claim 1, further comprising:

forming a sixth align key and a seventh align key in the wafer, the sixth align key and the seventh align key sequentially spaced apart from the second align key in the second direction;

forming a third line pattern in the wafer using the sixth align key; and forming a fourth line pattern in the wafer using the seventh align key;

wherein forming the first interposer includes forming the first line pattern and the third line pattern by cutting a space between the sixth align key and the seventh align key in the first direction.

8. The method of claim 7, wherein the forming of the third line pattern comprises forming the third line pattern such that the third line pattern overlaps a portion of the first line pattern.

9. The method of claim 7, wherein the third line pattern is formed using a first mask, and the fourth line pattern is formed using a second mask different from the first mask.

10. The method of claim 1, further comprising:

forming a sixth align key between the first align key and the second align key, and wherein the cutting of the space between the first align key and the second align key in the second direction comprises cutting the space between the first align key and the second align key in the second direction using the sixth align key.

11. The method of claim 1, further comprising:

disposing a plurality of first memory chips and a first logic chip on the first interposer, the plurality of first memory chips and the first logic chip being electrically connected to the first line pattern; and disposing a plurality of second memory chips and a second logic chip on the second interposer, the plurality of second memory chips and the second logic chip being electrically connected to the second line pattern.

12. A method of fabricating a semiconductor device, the method comprising:

providing an interposer, the interposer including a first direction edge portion, a second direction edge portion perpendicular to a first direction, and a line pattern;

disposing a logic chip on the interposer, the logic chip being electrically connected to the line pattern; and disposing memory chips on the interposer, the memory chips being electrically connected to the line pattern, wherein the line pattern is not in the first direction edge portion and is in the second direction edge portion.

13. The method of claim 12, wherein the memory chips includes first to third memory chips on the second direction edge portion on a first side of the interposer, and fourth to sixth memory chips on the second direction edge portion on a second side of the interposer opposite the first side.

14. The method of claim 13, wherein at least a portion of the first memory chip are on the first direction edge portion, and at least a portion of the fourth memory chip are on the first direction edge portion.

15. The method of claim 13, wherein the first to third memory chips are aligned in the first direction, the fourth to sixth memory chips are aligned in the first direction, and the logic chip is between the first to third memory chips and the fourth to sixth memory chips.

16. The method of claim 15, wherein at least a portion of the first memory chip and at least a portion of the third memory chip are on the first direction edge portion, and at least a portion of the fourth memory chip and at least a portion of the sixth memory chip are on the first direction edge portion.

17. A method of fabricating a semiconductor device, the method comprising:

providing an interposer including a line pattern;

disposing a logic chip at a center of an upper surface of the interposer, the logic chip being electrically connected to the line pattern;

disposing a plurality of first memory chips on a first side of the logic chip aligned in a first direction, the first memory chips are electrically connected to the line pattern; and disposing a plurality of second memory chips on a second side of the logic chip opposite the first side aligned in the first direction, the second memory chips are electrically connected to the line pattern, wherein a length of the interposer in the first direction is 34 mm to 40 mm.

18. The method of claim 17, wherein a length of the interposer in a second direction perpendicular to the first direction is 50 mm to 54 mm.

19. The method of claim 17, wherein the plurality of first memory chips include three first memory chips, and the plurality of second memory chips include three second memory chips.

20. The method of claim 17, wherein the semiconductor device includes a high-bandwidth memory (HBM) device.

* * * * *